US006238479B1

(12) United States Patent
Oba

(10) Patent No.: US 6,238,479 B1
(45) Date of Patent: May 29, 2001

(54) RAW MATERIAL FOR MANUFACTURING FLUORIDE CRYSTAL, REFINING METHOD OF THE SAME, FLUORIDE CRYSTAL, MANUFACTURING METHOD OF THE SAME, AND OPTICAL PART

(75) Inventor: Tomoru Oba, Kashiwa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/176,596

(22) Filed: Oct. 22, 1998

(30) Foreign Application Priority Data

Oct. 24, 1997 (JP) .................................... 9-293050
Oct. 21, 1998 (JP) ................................... 10-299291

(51) Int. Cl.[7] .................................................. C30B 9/08
(52) U.S. Cl. ................ 117/68; 117/77; 117/78; 117/81; 117/82; 117/940
(58) Field of Search ............... 117/940, 68, 77, 117/78, 81, 82

(56) References Cited

U.S. PATENT DOCUMENTS

| 3,981,818 | * | 9/1976 | Swinehart et al. ................. 252/300 |
| 4,030,965 | * | 6/1977 | Hammond et al. ................. 117/940 |
| 4,076,574 | * | 2/1978 | Pastor et al. ....................... 117/940 |
| 4,379,733 | * | 4/1983 | Pastor et al. ....................... 117/940 |
| 5,864,386 | * | 1/1999 | Nei ....................................... 355/30 |

FOREIGN PATENT DOCUMENTS

| 9-255328 | * | 9/1997 | (JP) ....................................... 117/78 |
| 10-001310 | * | 1/1998 | (JP) ....................................... 117/81 |

OTHER PUBLICATIONS

Mouchovski et al, "Growth of ultra–violet grade CaF crystals and their application for excimer laser optics"., Journal of Crystal Growth vol. 162 pp. 79–82, 1996.*
Stockbarger, "Artificial Fluorite", J. Opt. Soc. Am., vol. 39, No. 9, (Sep. 1949) 731–740.
Guggenheim, "Growth of Highly Perfect . . . Optical Masers", J. Appl. Phys., vol. 34, No. 8 (Aug. 1963) 2482–2485.
Robinson et al., "Growth of Laser–Quality . . . Fluoride Atmosphere", J. Appl. Phys., vol. 37, No. 5 (Apr. 1966) 2072–2074.
Chernevskaya et al., "The Production of Fluorite . . . Fluorine", Opt. Techn., vol. 39, No. 4 (Apr. 1972) 213–215.
Pastor, et al., "Crystal Growth . . . Reactive Atmosphere", Mat. Res. Bull., vol. 15 (1980) 469–475.
Radzhabov, et al., "Optical Properties of Oxygen . . . Fluorite", Physica Status Solidi (b) 136, (Short Notes) (1986) K55–K59.
Leckebusch, et al., "Perfektion . . . Zuchttechnik", J. Cryst. Growth, 13/14 (1972) 276–281.
Cockayne, et al., "Calcium Fluoride: . . . Growth", Nature, vol. 203, No. 4952 (Sep. 1964) 1376–1378.
Nassau, "Application of the Czochralski . . . Fluorides", J. Appl. Phys., vol. 32, No. 10, (Oct. 1961) 1920–1821.

* cited by examiner

*Primary Examiner*—Robert Kunemund

(57) ABSTRACT

The present invention provides a raw material for manufacturing an inexpensive fluoride crystal with excellent optical characteristics, and a method of manufacturing a fluoride crystal using a carbon fluoride-based gas that can easily be handled and is capable of preventing gases from being taken into a crystal to avoid degradation of transmittance, etc., and provides further a fluoride crystal and a manufacturing method thereof. A method of the present invention of refining a raw material for manufacturing a fluoride crystal comprises the steps of: charging a fluoride raw material into a crucible arranged within a refining furnace, introducing a reactive gas into a refining furnace, heating the fluoride raw material at a temperature lower than the melting point thereof in a reactive gas atmosphere, melting the fluoride raw material in the refining furnace filled with a vacuum atmosphere or an inert gas atmosphere, and then cooling and solidifying the fluoride raw material, and furthermore provides an optical part having transmission characteristics that hardly degrades when it is irradiated repeatedly for a long time with a light having a short wavelength and a high output.

31 Claims, 10 Drawing Sheets

RAW MATERIAL FOR MANUFACTURING FLUORIDE CRYSTAL, REFINING METHOD OF THE SAME, FLUORIDE CRYSTAL, MANUFACTURING METHOD OF THE SAME, AND OPTICAL PART

BACKGROUND OF THE INVENTION

1. Field of the Invention

The present invention relates to a raw material for manufacturing a fluoride crystal, a method of refining the raw material, a fluoride crystal, a method of manufacturing the fluoride crystal and an optical part, and more specifically to a raw material suited for manufacturing a fluoride crystal suited for various kinds of optical elements, lenses, window materials, prisms, etc. to be used in a broad wavelength range from the vacuum ultraviolet region to the far infrared region, in particular a calcium fluoride crystal to be used as an optical part for an excimer laser, a method of refining the raw material, a fluoride crystal and an optical part.

2. Related Background Art

Fluoride crystals such as calcium fluoride, which has high transmittance within a broad range of wavelengths from the vacuum ultraviolet region to the far infrared region, are widely utilized as various kinds of optical elements, lenses, window materials, prisms and so on.

Furthermore, fluorite (which exhibits an excellent transmission characteristic at short wavelengths) is useful as an optical member for excimer lasers, and in particular as a lens with a diameter of 200 mm and more. Crystals of calcium fluoride (which exhibits internal transmittance of 70% or higher for a light with a wavelength of 135 nm) has excellent durability against an ArF excimer laser and its transmittance hardly degrades even when it is repeatedly irradiated with a laser with a high output.

Such a fluoride crystal tends to become turbid white or opaque when only the raw material for the crystal is melted and crystallized by moving a crucible in a furnace with a temperature gradient.

(1) In order to obtain a crystal with an excellent transmission characteristic, it is therefore necessary to prevent oxidation of the raw material of the crystal and add a scavenger to remove impurities.

A technique has been developed to use lead fluoride as a scavenger (Stockbarger, J. Opt. Soc. Am. 39, (1949) pp. 731–740) as well as a technique to use cadmium fluoride as a scavenger (Radzhabov and Figura, Phys. Stat. Sol. (b) 136 (1986) pp. k55–k59).

(2) Furthermore, an attempt has been made to refine and grow a crystal by melting a raw material in the atmosphere of a reactive gas instead of a scavenger and then gradually cooling it. Hydrogen fluoride gas diluted with helium is used as a reactive gas (Guggenheim, J. Appl. Phys. 34, pp. 2482–2485 (1963), Robinson and Cripe, J. Appl. Phys. 37, pp. 2072–2074 (1966), etc.), which is, a mixture gas consisting of hydrogen fluoride gas, tetrafluoromethane, sulfur tetrafluoride and boron trifluoride (Pastor, Robinson and Braunstain, Mat. Res. Bull. 15, pp. 469–475 (1980)) as well as a cracked product gas of teflon (Chernevskaya and Korneva, Opt. Tech. 39, pp. 213–215 (1972)).

When a scavenger is used, however, metal elements constituting the scavenger remain in the crystal. Since metal elements which remain in larger amounts have a high possibility of having an adverse influence on the transmission characteristic, it is necessary to reduce the amount of metal elements that remain in the crystal by adding a smaller amount of the scavenger. When the scavenger is added in an amount that is too small, however, it reduces a scavenging effect, thereby allowing the transmission characteristic to degrade drastically due to oxidation, etc. of the raw material for the crystal. It is therefore important to define the optimum addition amount of the scavenger. However, the optimum addition amount varies depending on the water concentration and the content of impurities in the raw material for the crystal, and determination of the optimum addition amount requires remarkably complicated procedures, thereby raising manufacturing costs.

In cases where reactive gases are used, a phenomenon often occurs in which the reactive gas is dissolved in a melted fluid and is taken as air bubbles into a crystal (Guggenheim, J. appl. Phys. 34, pp. 2482–2485 (1963)). Satisfactory transmission characteristics are not obtained in almost all the cases.

SUMMARY OF THE INVENTION

The present invention has been accomplished in view of the technical problems described above, and an object of the present invention is to provide a raw material for an inexpensive fluoride crystal which has an excellent optical characteristic, a method of manufacturing the raw material which comprises using a reactive gas as a scavenger and appropriately defining a reaction temperature so that the components of the reactive gas are hardly incorporated into the crystal, and a fluoride crystal and a method of manufacturing the fluoride crystal.

Another object of the present invention is to provide an optical part having a transmission characteristic that is hardly degraded even when it is irradiated repeatedly for a long time with a light having a short wavelength and a high output.

Accordingly, the present invention provides a method of manufacturing a fluoride crystal, which comprises the steps of: heating a fluoride raw material at a temperature lower than the melting point of the fluoride raw material in a reactive gas atmosphere, then melting the fluoride raw material in a vacuum atmosphere or an inert gas atmosphere and subsequently cooling the fluoride raw material to crystallize the fluoride raw material.

Furthermore, the present invention provides a method of refining a raw material for a fluoride crystal, which comprises the steps of: heating a fluoride raw material at a temperature lower than the melting point of the fluoride raw material in a reactive gas atmosphere, then melting the fluoride raw material in a vacuum atmosphere or an inert gas atmosphere and subsequently cooling the fluoride raw material to solidify the fluoride raw material.

The present invention is capable of providing a fluoride crystal with a transmission characteristic that is hardly degraded even when it is irradiated repeatedly for a long time with a light having a short wavelength and a high output. As a result, the present invention makes it possible to provide not only an optical part for an excimer laser which has high stability and high reliability but also an optical system for an exposure apparatus.

DETAILED DESCRIPTION OF THE PREFERRED EMBODIMENTS

Figure 1:
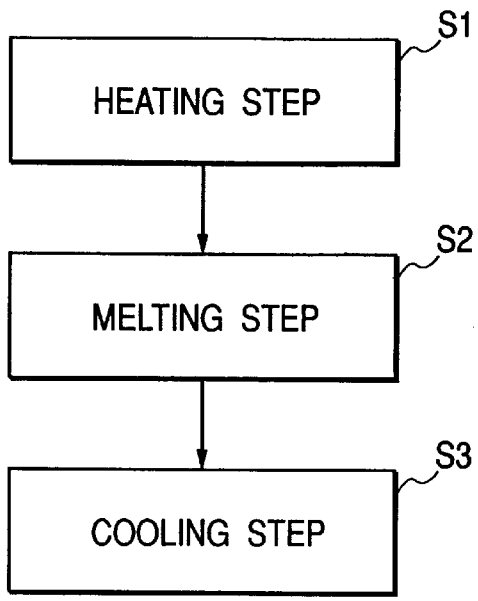
FIG. 1 is a flowchart illustrating a heating step to a cooling step.

FIG. 1 shows the steps of a method of refining a raw material for manufacturing a fluoride crystal or a method of manufacturing a fluoride crystal, according to one embodiment of the present invention.

For refining a fluoride raw material, a powdery or granular fluoride raw material is first placed and heated in a refining furnace at a step S1. The atmosphere at this step is a reactive gas atmosphere.

For example, calcium fluoride, barium fluoride and magnesium fluoride and the like are usable as the raw material fluoride according to the present invention. It is preferable to use the raw material which contains at least one kind of the rare earth elements in a total amount not exceeding 10 ppm.

It is preferable to use as the reactive gas a fluorine compound, in particular a carbon fluoride-based gas, which reacts with an oxide. It is preferable to use one, two or more kinds of gases selected from the group consisting of tetrafluoromethane ($CF_4$), trifluoromethane ($CHF_3$), difluoromethane ($CH_2F_2$), hexafluoroethane ($C_2F_6$) and octafluoropropane ($C_3F_8$). In addition to these fluoride gases, it is possible to use HF, $NF_3$, $SF_6$, $XeF_2$, $BF_3$ and so on. It is also possible to use these gases under conditions in which they are diluted with an inert gas such as Ar, He, Ne, Xe or the like. When the reactive gas is diluted with such an inert gas, it is easily decomposable, thereby accelerating reaction.

Such a carbon fluoride-based gas is preferably used since it exhibits a remarkably higher effect of removing oxides in the solid phase than other fluoride gases. Also from the viewpoint that the carbon fluoride-based gas has a low corrosive property and can be handled easily, it is preferable to use a carbon fluoride-based gas rather than other reactive gases.

The heating temperature of the fluoride raw material in the heating step S1 is lower than the melting point of the raw material. The heating temperature is preferably 50 to 200° C. lower by than the melting point, more preferably 75 to 175° C. lower than the melting point, and most preferably 100 to 150° C. lower than the melting point. At a heating temperature closer to the melting point, the reactive gas is more likely to remain in the raw material and may lower the light-transmissive property of the crystal. At a heating temperature 200° C. lower by than the melting point, reaction with oxides may be insufficient.

The heating time at the step S1 is preferably 4 to 30 hours, more preferably 8 to 25 hours, and most preferably 10 to 20 hours. A heating time shorter than 4 hours may make the reaction with the oxide insufficient, whereas a heating time exceeding 30 hours tends to allow a furnace to be damaged by hydrogen fluoride produced by the reaction. It is not always necessary to maintain a constant temperature for the heating time. The temperature may be varied continuously or intermittently over the heating time. When the temperature is raised, for example, from a temperature that is 200° C. lower than the melting point to a temperature that is 50° C. lower than the melting point, the temperature raising time may be regarded as the heating time.

The pressure in the step S1 is preferably 0.01 higher than atmospheric pressure, more preferably within a range from 0.1 to 1 atmospheric pressure. A large amount of impurities can be removed from the raw material by setting a pressure at a high level within the range defined above. For the refining step in which a large amount of impurities are to be removed, it is preferable to set a pressure higher than that to be set in the step for growing a single crystal.

After carrying out the heating step S1 by introducing the reactive gas, the fluoride raw material is melted in a vacuum atmosphere or an inert gas atmosphere in a melting step S2. In the case of a vacuum atmosphere, it is preferable to set a pressure (vacuum degree) lower than $1 \times 10^{-5}$ Torr. A vacuum degree lower than $1 \times 10^{-5}$ Torr makes it possible to finally obtain a single crystal of a fluoride that has an excellent transmissive property. In the present invention, 1 atmospheric pressure is 760 Torr or approximately 101.32 kPa.

As the inert gas atmosphere in the step S2, it is preferable to use an atmosphere of at least one kind selected from rare gases such as He, Ne, Ar, Xe and so on. In the atmosphere of the melting step S2, little reactive gas remains, at an amount that is not large enough to lower the internal transmittance of a fluoride crystal. The pressure of the inert gas may be adequately selected within a range from $1 \times 10^{-5}$ Torr to a pressurized level exceeding 1 atmospheric pressure.

After the fluoride raw material is heated to a temperature higher than the melting point of the fluoride raw material and melted, the raw material is cooled in a cooling step S3.

In a case where the raw material is refined through a series of steps as shown in FIG. 1, the raw material may be cooled rapidly, since the crystals obtained by cooling the raw material may not be a single crystal.

The cooling rate is preferably 300° C./h or lower.

When the steps shown in FIG. 1 are to be adopted as a method of manufacturing a single crystal of a fluoride, a cooling rate is preferably about 3 to 4° C./h.

Bridgman's method is preferably used for growing a crystal.

Figure 2:
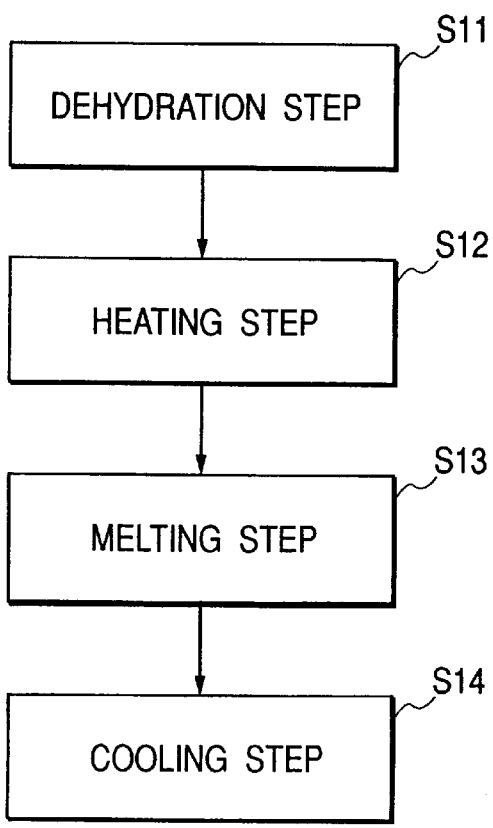
FIG. 2 is a flowchart illustrating a dehydrating step to a cooling step.

FIG. 2 is a flowchart of a method of refining a raw material for manufacturing a fluoride crystal or a method of manufacturing a fluoride crystal according to another embodiment of the present invention.

By comparing the flowchart shown in FIG. 2 with that shown in FIG. 1, it is apparent that the raw material is dehydrated prior to a heating step S12 in this embodiment. In other words, it can be said that the heating step S12 includes a dehydrating step.

In a dehydration step Sil, after the fluoride raw material is charged into a furnace, dehydration of the raw material is carried out by filling the furnace with a vacuum atmosphere or an inert gas atmosphere and heating it to 100 to 300° C. before introduction of an active gas. It is preferable to dehydrate the raw material once until the vacuum degree becomes lower than $1 \times 10^{-5}$ Torr.

The dehydration is physical elimination by heat.

At a temperature lower than 100° C., moisture attached to the fluoride raw material or the inside wall of the refining furnace can not be eliminated sufficiently. At a temperature exceeding 300° C., the reaction expressed by Equation 1 proceeds, thereby producing a large amount of oxides.

The heating temperature is preferably 100 to 300° C., in particular 150 to 200° C.

$$CaF_2+H_2O \rightarrow CaO+2HF \quad \text{(Equation 1)}$$

Dehydration to a vacuum degree lower than $1\times10^{-5}$ Torr can be considered to complete elimination of moisture from the fluoride raw material or the inside wall of the refining furnace, and to exhaust the eliminated moisture out of the refining furnace, thereby accomplishing the object of dehydration.

For dehydrating the raw material in the inert gas atmosphere, it is sufficient to set a pressure not exceeding 0.1 atmospheric pressure, preferably not exceeding $1\times10^{-3}$ Torr, or more preferably not exceeding $1\times10^{-4}$ Torr, and to purge the interior of the furnace with an inert gas. The dehydration step S11 is carried out for about several hours, preferably 24 hours or longer, and more preferably for about 40 hours.

The heating step S12, a melting step S13 and a cooling step S14, which are subsequent to the dehydration step S11, may be carried out similarly to steps Si, S2 and S3 shown in FIG. 1, respectively.

Figure 3:
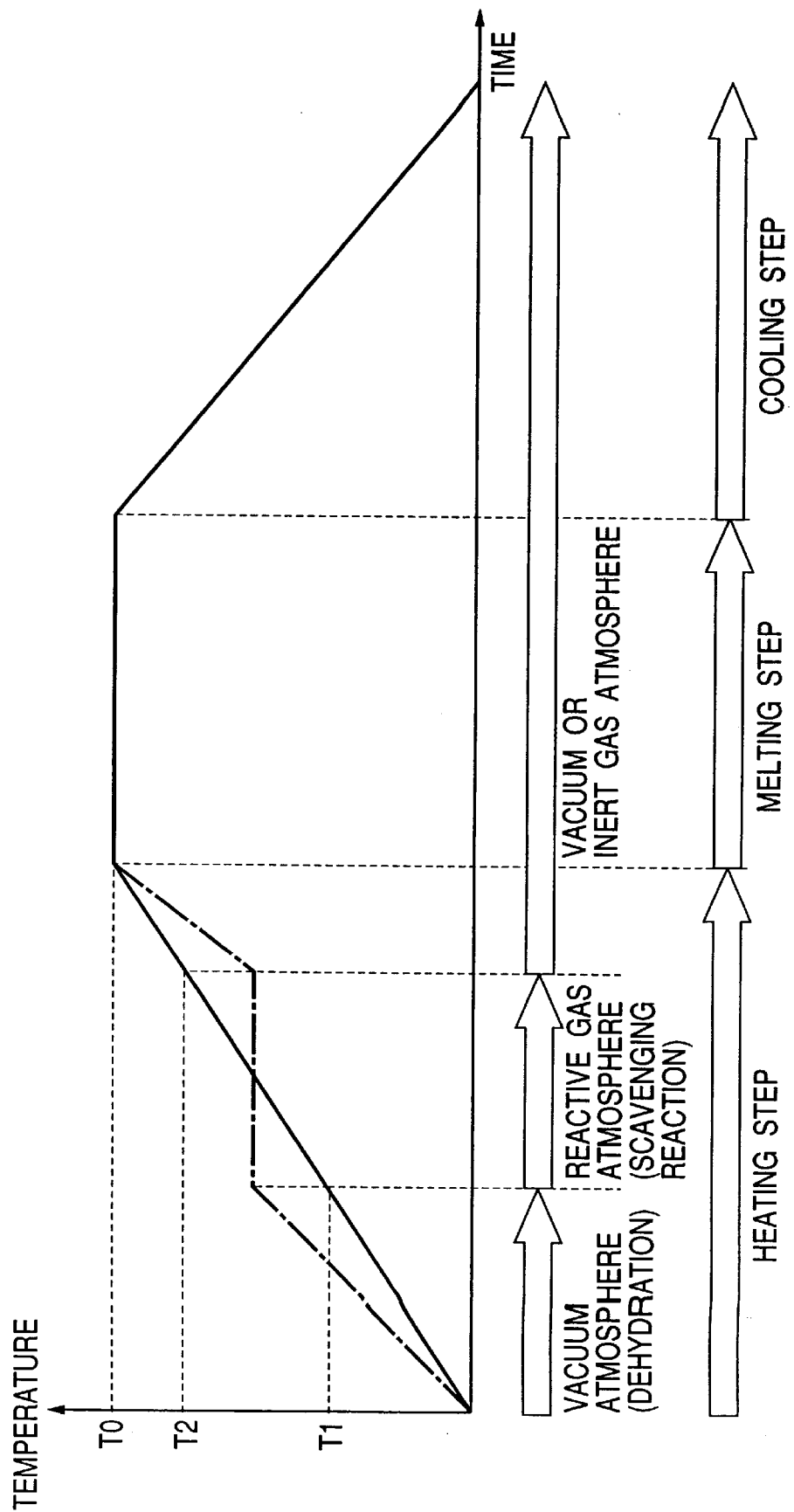
FIG. 3 is a diagram illustrating variations of atmosphere at a refining step.

FIG. 3 illustrates temperature variations with the lapse of time.

A reference symbol T0 in FIG. 3 indicates the melting point of a fluoride.

As already described above, T1 in FIG. 3 is preferably selected from the range of 100° C. to 300° C., and T2 in FIG. 3 is preferably selected from the range of a temperature 200° C. lower than the melting point to a temperature 50° C. lower than the melting point.

Furthermore, it is preferable to control the temperature by changing the heating rate at least once, as indicated by the chain line in FIG. 3.

In addition, the raw material may be heated to a temperature exceeding the melting point in the melting step.

The method of manufacturing a fluoride crystal according to the present invention comprises charging the raw material for manufacturing the fluoride crystal which is refined by the refining method described above into a crucible placed in a growing furnace, filling the growing furnace with an inert gas atmosphere or a vacuum atmosphere, and melting the raw material for manufacturing the fluoride crystal. It is preferable to refine the raw material before melting it. In other words, to obtain a more favorable transmissive property, it is preferable to refine, before melting, the raw material once again in the growing furnace according to the same procedures as those of the refining method according to the present invention. However, this refining is not always necessary when the oxide has been sufficiently eliminated in the refining step of the raw material for manufacturing a fluoride crystal and moisture has been sufficiently eliminated from the atmosphere in the growing furnace.

Figure 4:
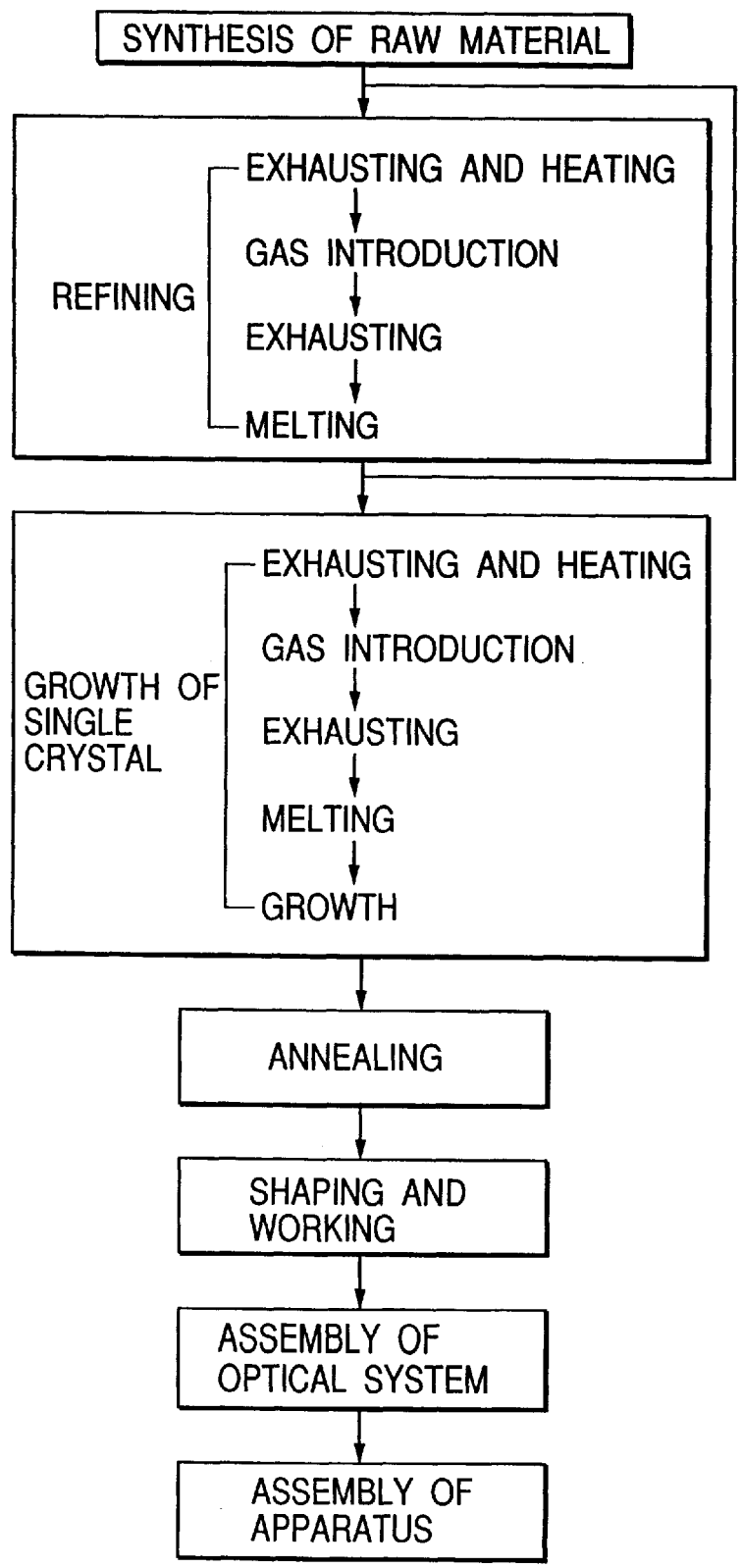
FIG. 4 is a flowchart illustrating steps from synthesis of a raw material to an assembly of a system.

FIG. 4 shows a flowchart illustrating manufacturing steps for a crystal according to still another embodiment of the present invention.

In order to obtain a crystal that has an excellent transmission characteristic, it is necessary to use a powdered raw material with a high purity, although this varies depending on the transmission characteristic demanded for the crystal. When a high purity raw material is used, it is possible to omit the refining step described below.

In order to manufacture a calcium fluoride crystal for an excimer laser, it is preferable to prepare a raw material that contains at least one kind of rare earth elements in a total amount of less than 10 ppm.

(Refining step)

Figure 5:
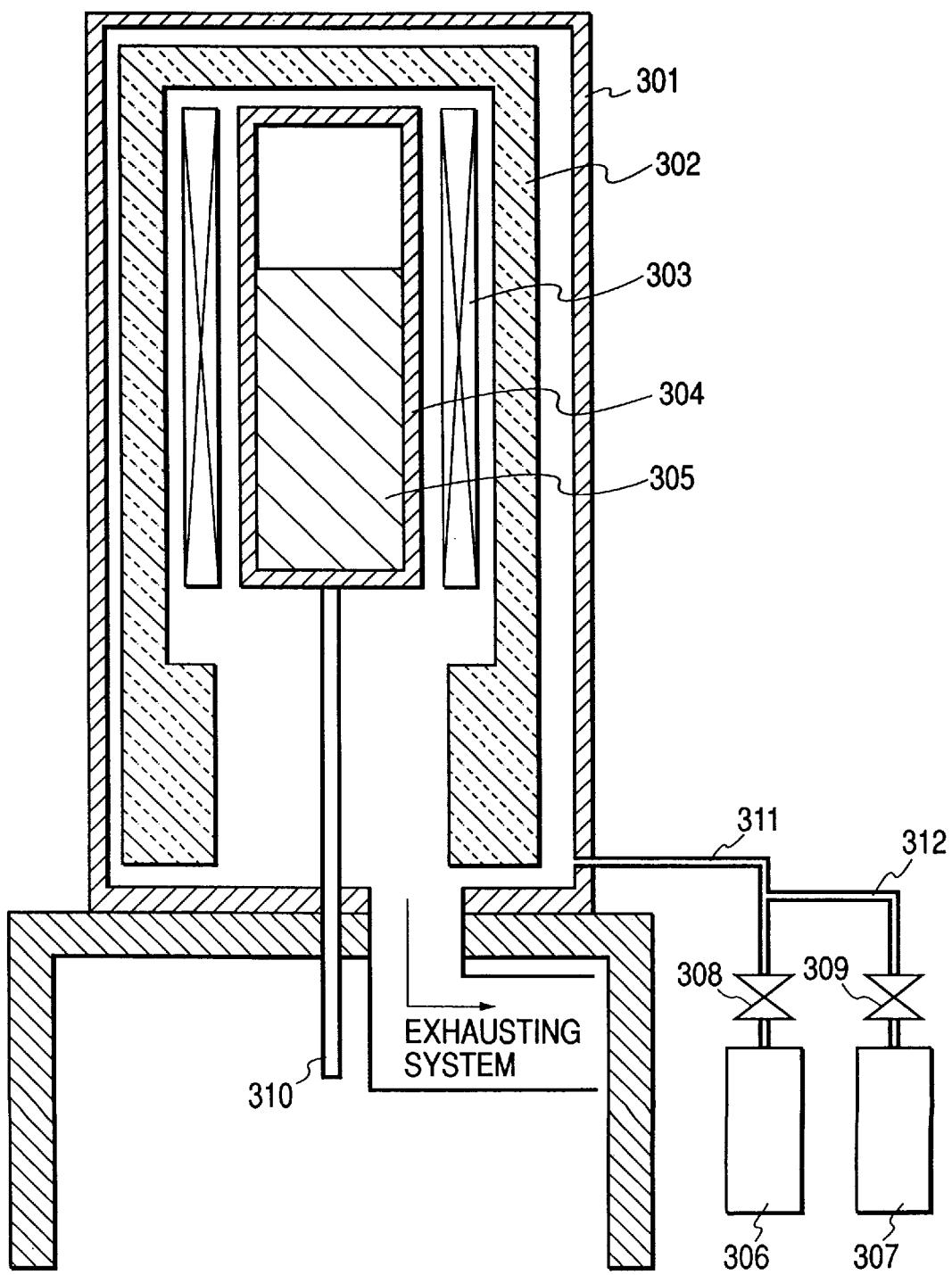
FIG. 5 is a sectional view of a refining apparatus.

A fluoride raw material is put into a crucible 304 which is placed in a refining furnace as shown in FIG. 5. In FIG. 5, reference numeral 301 indicates a chamber of the refining furnace which is connected to an evacuation (vacuum-exhausting) system. Reference numeral 302 indicates a heat insulating material, 303 a heater, 304 the crucible, and 305 the fluoride raw material. Reference numeral 306 designates a reactive gas source connected to the refining furnace through a pipeline 311 by way of a valve 308. Reference numeral 307 denotes an inert gas source which is connected to the pipeline 311 through a pipeline 312 by way of a valve 309. By opening the valves 308 and 309, a reactive gas diluted with an inert gas can be introduced into the chamber 301 of the refining furnace. Mass flow controllers may be disposed on the pipelines 311 and 312 to control the flow rates of the reactive gas and the inert gas.

After evacuating the refining furnace to vacuum, the fluoride raw material 305 is heated by electrically energizing the heater while carrying on vacuum evacuation. Moisture adsorbed in the fluoride raw material 305 and moisture attached to the inside walls of the refining furnace are eliminated by maintaining the internal temperature of the refining furnace from about 100° C. to about 300° C. (dehydration).

When the vacuum degree becomes lower than $1\times10^{-5}$ Torr in the refining furnace, the valve 308 is opened to introduce the reactive gas (for example, carbon fluoride-based gas) from the reactive gas source 306 into the chamber 301 of the refining furnace (gas filling). Since the dehydration may be insufficient at a vacuum degree of $1\times10^{-5}$ Torr or higher, it is preferable to introduce the inert gas after the vacuum degree becomes lower than $1\times10^{-5}$ Torr.

Further, it is preferable to open both valves 308 and 309 so that the reactive gas is diluted with an inert gas such as Ar or He supplied from the inert gas source 307.

Furthermore, it is preferable to fill the inside of the chamber 301 of the refining furnace with the reactive gas under a pressure lower than 1 atmospheric pressure. A pressure exceeding 1 atmospheric pressure tends to allow the reactive gas to remain in the raw material.

The fluoride raw material 305 is gradually heated and maintained at a temperature just below the melting point thereof for a predetermined time.

In this course, the carbon fluoride-based gas changes oxides contained in the fluoride raw material into fluorides. For example, tetrafluoromethane changes calcium oxide into calcium fluoride as expressed by the following Equation 2:

$$2CaO+CF_4 \rightarrow 2CaF_2+CO_2 (1000° \text{ C. or higher}) \quad \text{(Equation 2)}$$

Thereafter, the chamber 301 of the refining furnace is evacuated to vacuum. It is preferable to 20 evacuate the chamber 301 to a vacuum degree lower than $1\times10^{-5}$ Torr. Alternatively, the internal gas of the chamber 301 of the refining furnace may be replaced with an inert gas such as Ar or He by opening the valve 309 after closing the valve 308 and evacuating the chamber 301 to a vacuum degree lower than $1\times10^{-5}$ Torr. Then, the fluoride raw material 305 is further heated for complete melting. Successively, the melted raw material is gradually cooled (cooling) for growing a crystal (melting and growing).

A block of the fluoride raw material is obtained at this step. Since this crystal block of the fluoride raw material may have grain boundaries, the cooling step does not require strict temperature control unlike the single-crystal growing step described later. It is preferable to pull the crucible 304 downward with a pull-down rod 310 in gradual cooling. The effect of eliminating impurities is further enhanced by pulling the crucible downward.

In particular, the upper portion of the obtained block, i.e., the portion which is crystallized last, is removed from the block of the fluoride raw material. Since impurities are apt to be concentrated into this portion, impurities which adversely affect characteristics are eliminated by removing this portion.

As occasion demands, the block of the fluoride raw material is placed in the crucible of the refining furnace, and the series of steps from gas filling, melting, and growing to upper portion removal are repeated a plurality of times.
(Single-crystal growing step)

Figure 6:
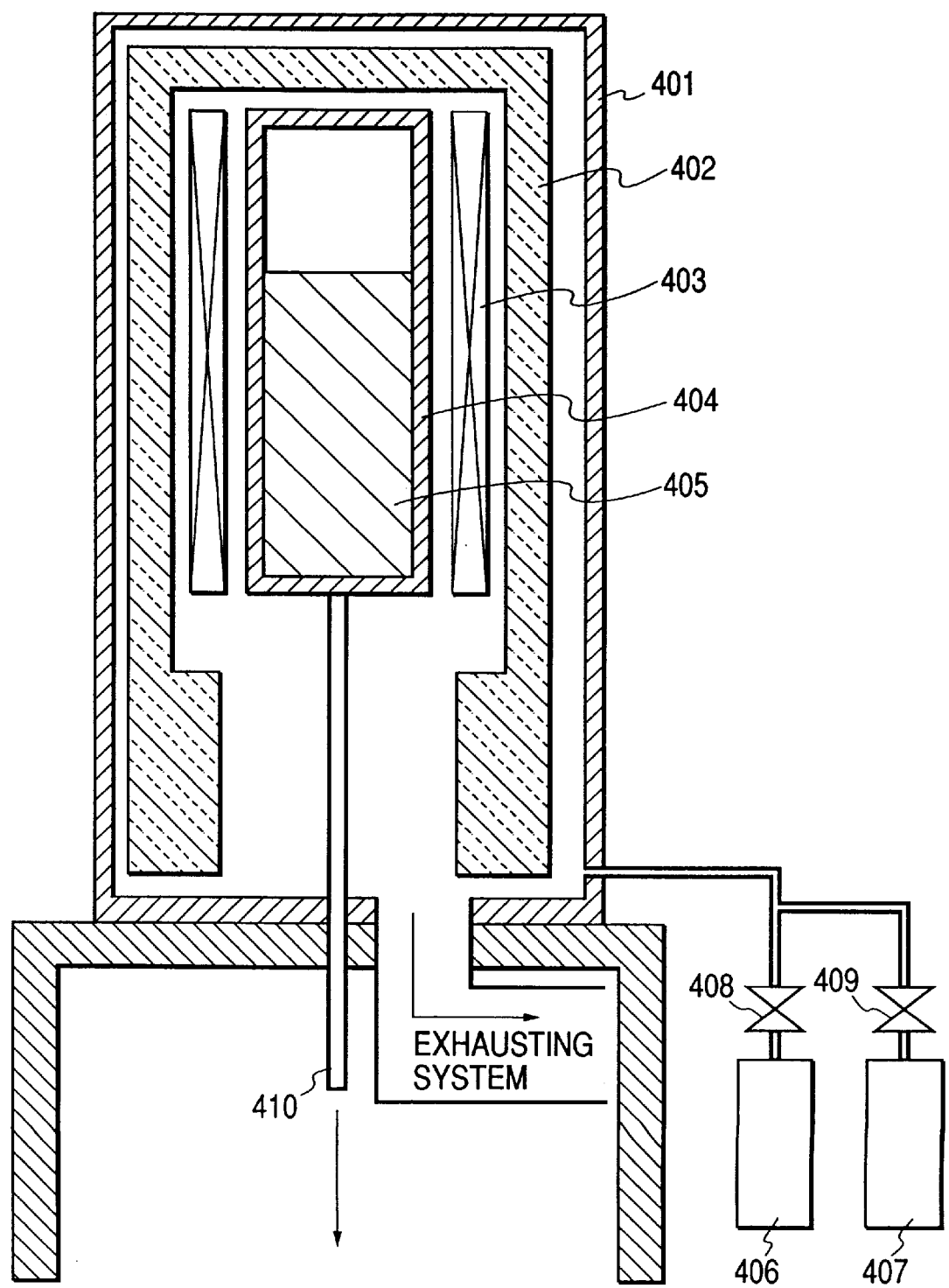
FIG. 6 is a sectional view of a growing apparatus.

Then, the refined block of the fluoride raw material is put into a crucible and the crucible is placed in a growing furnace shown in FIG. 6. In FIG. 6, reference numeral 401 indicates a chamber of the growing furnace connected to an evacuation (vacuum-exhausting) system. 402 designates a heat insulating material, 403 a heater, 404 a crucible and 405 the block of fluoride raw material. In addition, a reference numeral 410 denotes a crucible pull-down rod, 406 a reactive gas source, 407 an inert gas source, and 408 and 409 valves. Reference numerals 311 and 312 indicate pipelines similar to those of the refining furnace shown in FIG. 5, which are arranged so as to permit diluting a reactive gas with an inert gas in the pipeline 311.

Dehydration, gas filling and melting steps are carried out similarly to the refining step, the crucible 404 is gradually pulled downward with the crucible pull-down rod 410 and the raw material is cooled to grow a single crystal (Bridgman's method). The gas filling step is carried out for the purpose of returning the oxide (Equation 1) produced by reacting the block fluoride raw material with moisture on surfaces of the block fluoride raw materials and in structural members such as the heat insulating material in the growing furnace to the fluoride (Equation 2), and may be omitted when dehydration is sufficiently carried out before the gas filling step.

In order to obtain a good crystal with few defects (voids and dislocation), it is preferable to pull the crucible down at a rate of 0.1 to 5.0 mm per hour at the gradually cooling step.
(Annealing step)

Figure 7:
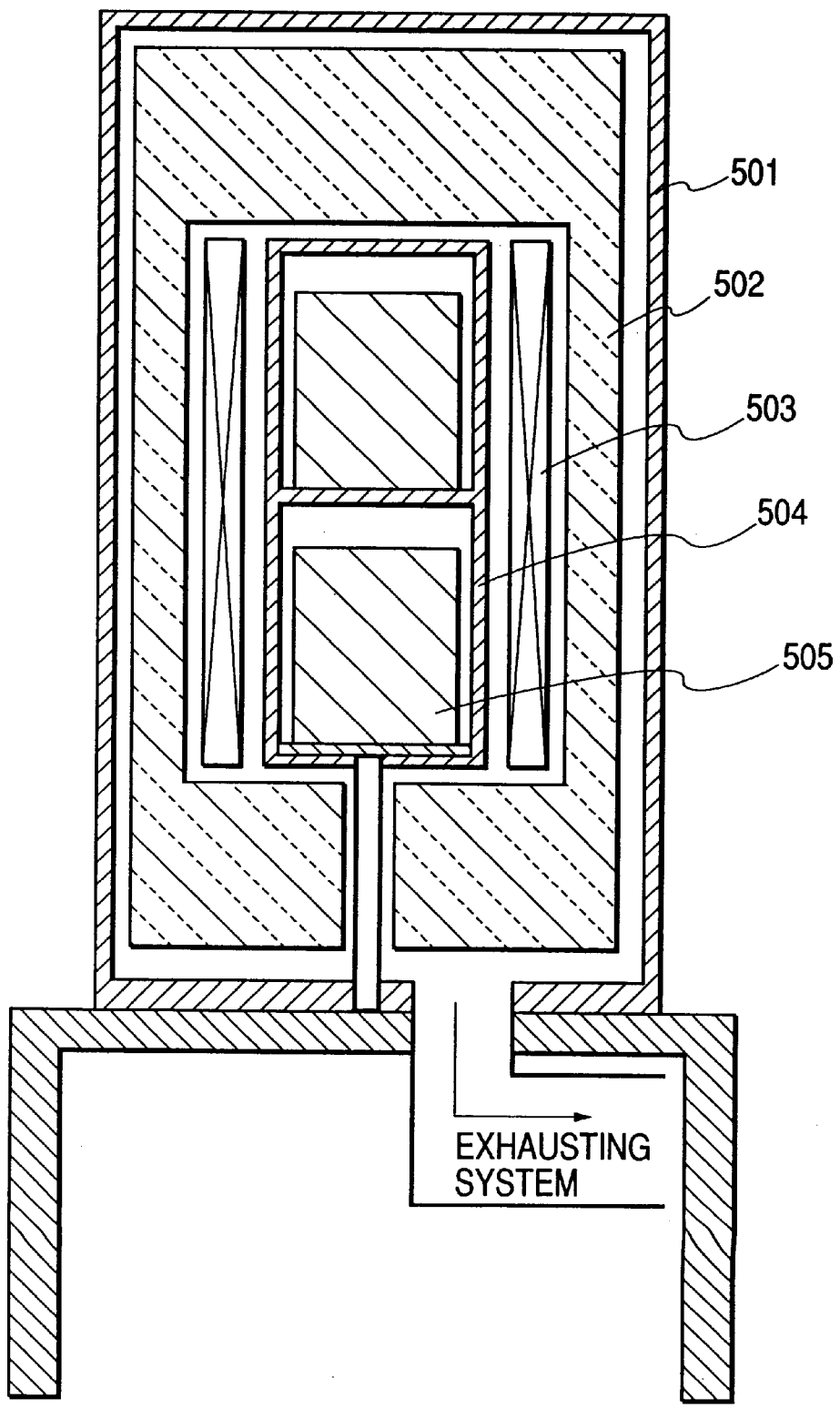
FIG. 7 is a sectional view of an annealing apparatus.

A grown fluoride crystal is successively treated in an annealing furnace shown in FIG. 7. In FIG. 7, reference numeral 501 indicates a chamber of the annealing furnace, 502 a heat insulating material, 503 a heater, 504 a crucible and 505 the fluoride crystal.

In this annealing step, the crucible 504 is heated to a temperature 400 to 500° C. lower than the melting point of the fluoride crystal. The fluoride crystal is heated for at least 20 hours, and preferably for 20 to 30 hours. In the case of a fluoride crystal such as magnesium fluoride that is resistant to thermal shock, the annealing step may be omitted.
(Working step and assembly step)

Then, the fluoride crystal is shaped into the form of the required optical part (convex lens, concave lens, disk, plate or the like). When the optical part is made of, for example, calcium fluoride, it has an excellent characteristic of internal transmittance of 70% or more for a light with a wavelength of 135 nm.

Furthermore, it is preferable to dispose an antireflection film on the surface of the optical part made of the fluoride crystal as occasion demands. A film of magnesium fluoride, aluminium oxide or aluminium fluoride, which is preferably used as an antireflection film, can be formed by electric resistance heating deposition, electron beam deposition, sputtering or the like. The optical part according to the present invention contains substantially no water and exhibits excellent adherability to antireflection film.

By variously combining different kinds of lenses obtained as described above, it is possible to compose optical systems suited for use in excimer lasers, in particular ArF excimer lasers. When the fluoride crystal is made of calcium fluoride, in particular, an exposure apparatus such as a stepper or a scanner can be composed by combining an optical system comprising an excimer laser source and lenses made of calcium fluoride crystal with a stage capable of moving a substrate having a layer of a photosensitive material formed thereon.
(Exposure apparatus)

Now, description will be made of an exposure apparatus comprising optical parts according to the present invention.

An exposure apparatus includes a contracting projector type exposure apparatus which uses a lens optical system or a lens type equi-magnification projector type exposure apparatus.

It is preferable to use optical parts according to the present invention, in particular, in a stepper of a step-and-repeat type capable of exposing one narrow section (field) of a water, moving the water by one step and then exposing one adjacent field so as to expose an entire surface of a water. Needless to say, the optical parts according to the present invention are preferably usable in a micro scan type exposure apparatus.

Figure 9:
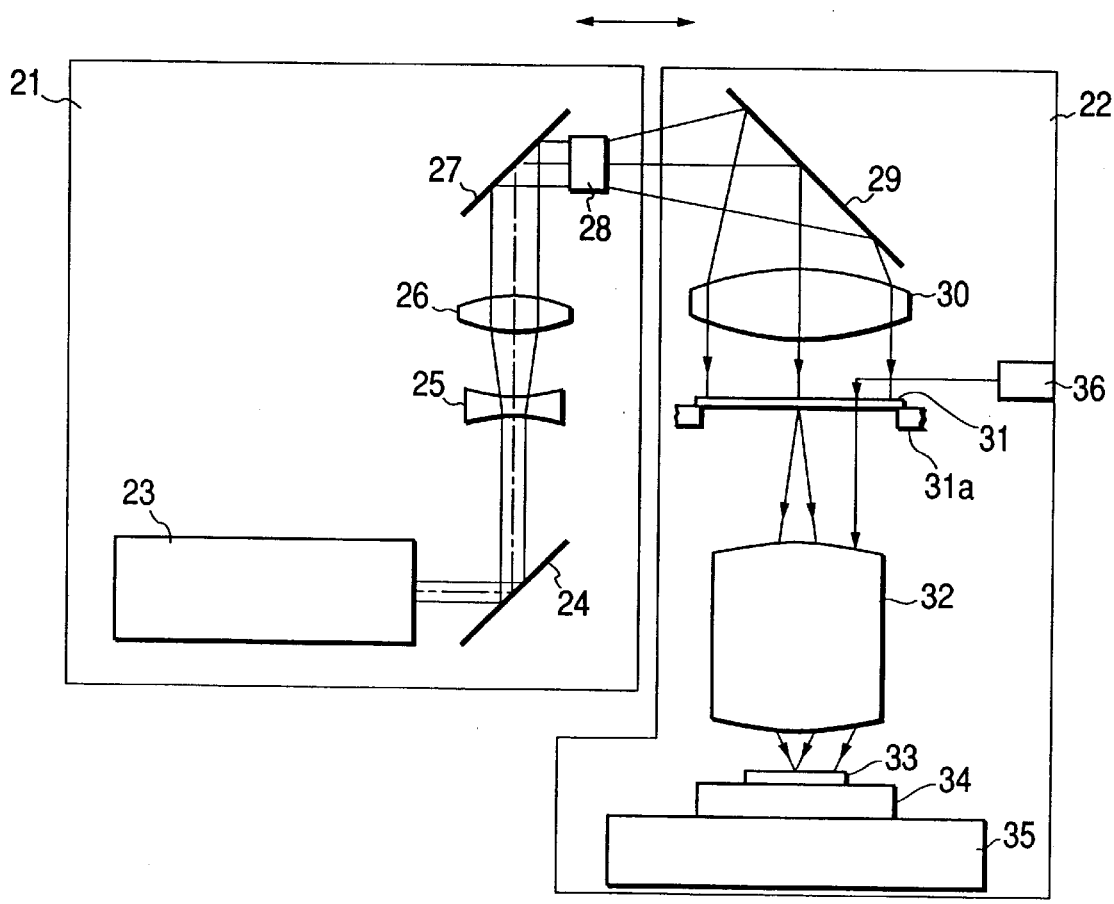
FIG. 9 is a diagram schematically showing a configuration of an exposure apparatus in which the fluoride crystal according to the present invention is used as an optical part.

FIG. 9 shows a schematic configuration of an exposure apparatus according to the present invention. In FIG. 9, reference numerals 21 and 22 indicate an illumination light source section and an exposure mechanism section, respectively, which are composed separately or independently. In other words, these sections are set up in conditions where they are physically separated. A reference numeral 23 designates an illumination light source such as an excimer laser that is large and provides a high output. Reference numeral 24 denotes a mirror, 25 a concave lens, and 26 a convex lens. The lenses 25 and 26 have the role of a beam expander that expands the diameter of a laser beam to the approximate size of an optical integrator. Reference numeral 27 denotes a mirror and 28 indicates an optical integrator for uniformly illuminating a reticle. The illumination light source section 21 is composed of the members from the laser beam source 23 to the optical integrator 28. Reference numeral 29 indicates a mirror and 30 designates a condenser lens which collimates a light bundle emerging from the optical integrator 28. Reference numeral 31 denotes a reticle on which a circuit pattern is traced, 31*a* indicates a reticle holder which adsorbs or holds the reticle, 32 designates a projecting optical system that projects an image of the circuit pattern of the reticle and 33 denotes a wafer on which the circuit pattern of the reticle 31 is to be printed by the projector lens 32. Reference numeral 34 indicates an XY stage which adsorbs or holds the wafer 33 and moves in directions X and Y for printing in a step-and-repeat mode. Reference numeral 35 designates a table of the exposure apparatus.

The exposure mechanism section 22 is composed of the members from the mirror 29, which constitutes a portion of the illumination optical systems, to the table 35. Reference numeral 36 indicates an alignment means used for TTL alignment. The exposure apparatus is usually equipped additionally with an automatic focusing mechanism, a wafer carrying mechanism, etc. which are also parts of the exposure mechanism section 22.

Figure 10:
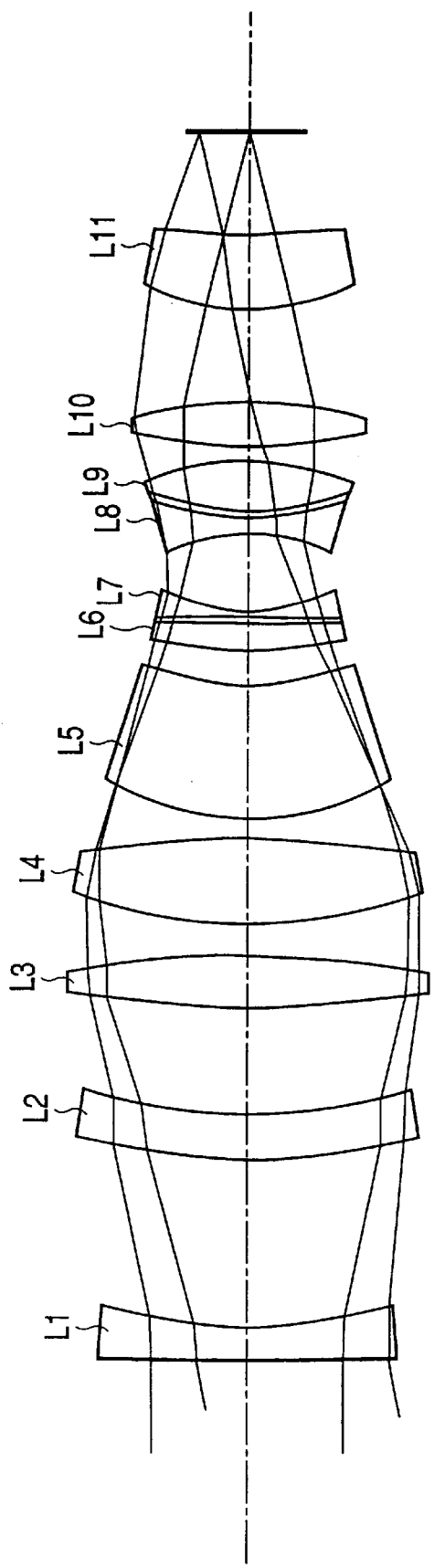
FIG. 10 is a schematic diagram showing a projecting optical system of an exposure apparatus in which the fluoride crystal according to the present invention is used as an optical part.

FIG. 10 exemplifies optical parts to be used in the exposure apparatus according to the present invention, or an assembly of lenses which are used in the projector optical system of the exposure apparatus shown in FIG. 9. This lens assembly is composed of eleven lenses L1 to L11 which are combined without being adhered to one another. The optical parts according to the present invention which are made of fluorite are used as the lenses and mirrors shown in FIGS. 6 and 7 or mirrors and lenses of a mirror type exposure apparatus (not shown in the drawings). It is preferable to dispose an antireflection film or reflection enhancing film on the surface of the lens or the mirror.

Optical parts according to the present invention that are made of a fluoride crystal can be used as prisms and etalons.

Figure 11A:
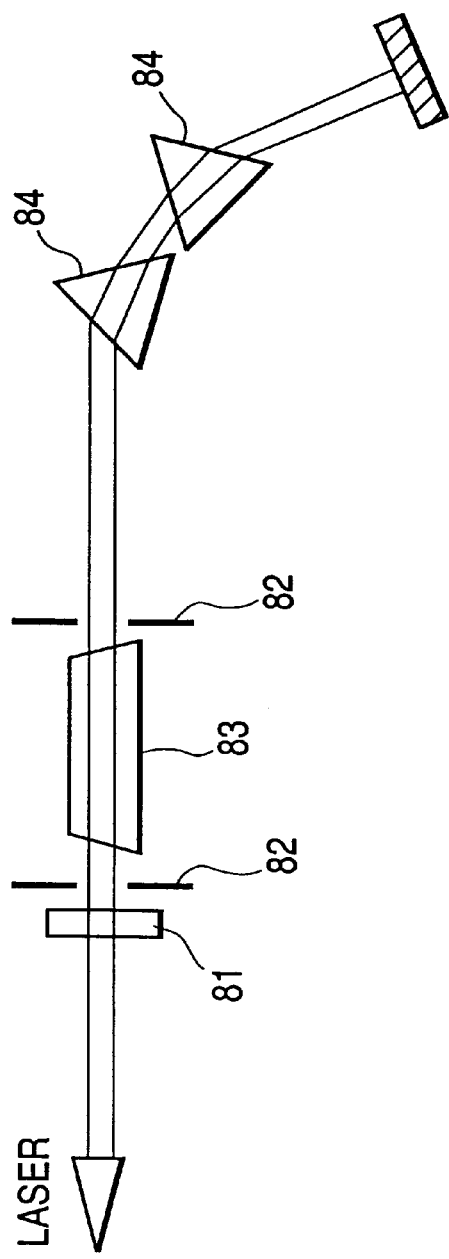
FIGS. 11A and 11B are schematic diagrams showing optical systems for excimer laser oscillators in which the fluoride crystal according to the present invention is used.
Figure 11B:
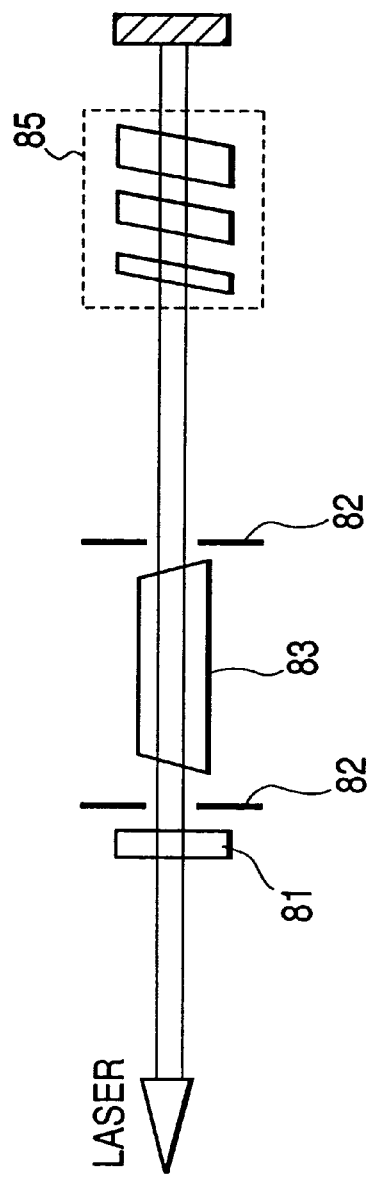

FIGS. 11A and 11B are diagrams schematically A showing configurations of excimer laser oscillators using the optical parts according to the present invention which are made of a fluoride crystal.

The excimer laser oscillator shown in FIG. 11A is composed of a resonator 83 which emits an excimer laser for resonance, diaphragm holes 82 which throttle the excimer laser emitted from the resonator 83, prisms 84 which monochromate the excimer laser and a reflecting mirror 81 which reflects the excimer laser.

Further, the excimer laser oscillator shown in FIG. 11B is composed of a resonator 83 which emits an excimer laser for resonance, diaphragm holes 82 which throttle the excimer laser emitted from the resonator 83, an etalon 85 which monochromates the excimer laser and a reflecting mirror 81 which reflects the excimer laser.

An excimer laser oscillator which comprises the optical parts of the present invention made of a fluoride crystal as prisms or an etalon is capable of shortening the wavelength of an excimer laser by means of the prisms or etalon. In other words, the excimer laser oscillator is capable of monochromating an excimer laser.

When the exposure apparatus is used to irradiate a photosensitized type resist on a substrate with an excimer laser through a pattern on a reticle, it is possible to form a latent image which corresponds to a pattern to be formed.

Now, the present invention will be described in more detail with reference to examples thereof.

Example 1

After inputting a high purity synthesized calcium fluoride raw material (having a melting point of 1360° C.) that contains rare earth elements in an amount not exceeding 10 ppm into the crucible 304 of the refining furnace shown in FIG. 5 and evacuating the furnace to a vacuum, the calcium fluoride raw material was dehydrated by heating it to 300° C.

After the vacuum degree attained $1 \times 10^{-6}$ Torr or less in the chamber 301 of the refining furnace, tetrafluoromethane diluted with Ar to about 30% was charged into the chamber 301 and the pressure in the chamber 301 of the refining furnace was adjusted to 0.5 atmospheric pressure.

After raising the temperature at a rate of approximately 50° C./h in the temperature range lower than the melting point of the calcium fluoride, i.e., from 300° to 1250° C., the chamber 301 of the refining furnace was evacuated to a vacuum.

After the vacuum degree attained $1 \times 10^{-5}$ Torr or less in the chamber 301 of the refining furnace, the fluoride raw material was further heated to 1380° C. to completely melt it. Then the crucible 304 was pulled down with the pull-down rod 310 to gradually cool the raw material, whereby a polycrystal of a block raw material of the fluoride was obtained.

An upper portion of 1 mm thick corresponding to an upper portion of the crucible was removed from the block of the calcium fluoride raw material.

Then, the block of the raw material of calcium fluoride was put into the single-crystal growing crucible 404 of the growing furnace shown in FIG. 6. After evacuating the inside of the chamber 401 of the growing furnace to vacuum, the dehydration, gas filling and melting were carried out similarly to the refining step described above.

After maintaining the vacuum degree and temperature at $2 \times 10^{-6}$ Torr and 1360° C. for 11 hours, respectively, the crucible 404 for growing was pulled down at a speed of 2 mm/h. This pull-down speed corresponds to a cooling rate of approximately 3 to 4° C./h.

The grown single crystal of calcium fluoride and zinc fluoride of 0.1% by weight were put into the crucible 504 of the annealing furnace shown in FIG. 7. After evacuating the chamber 501 of the annealing furnace to a vacuum and increasing the temperature of the crucible 504 from room temperature to 900° C. at a rate of 100° C./h, the temperature was kept at 900° C. for 20 hours. Then, the temperature was decreased to room temperature at a rate of 6° C./h.

Figure 8:
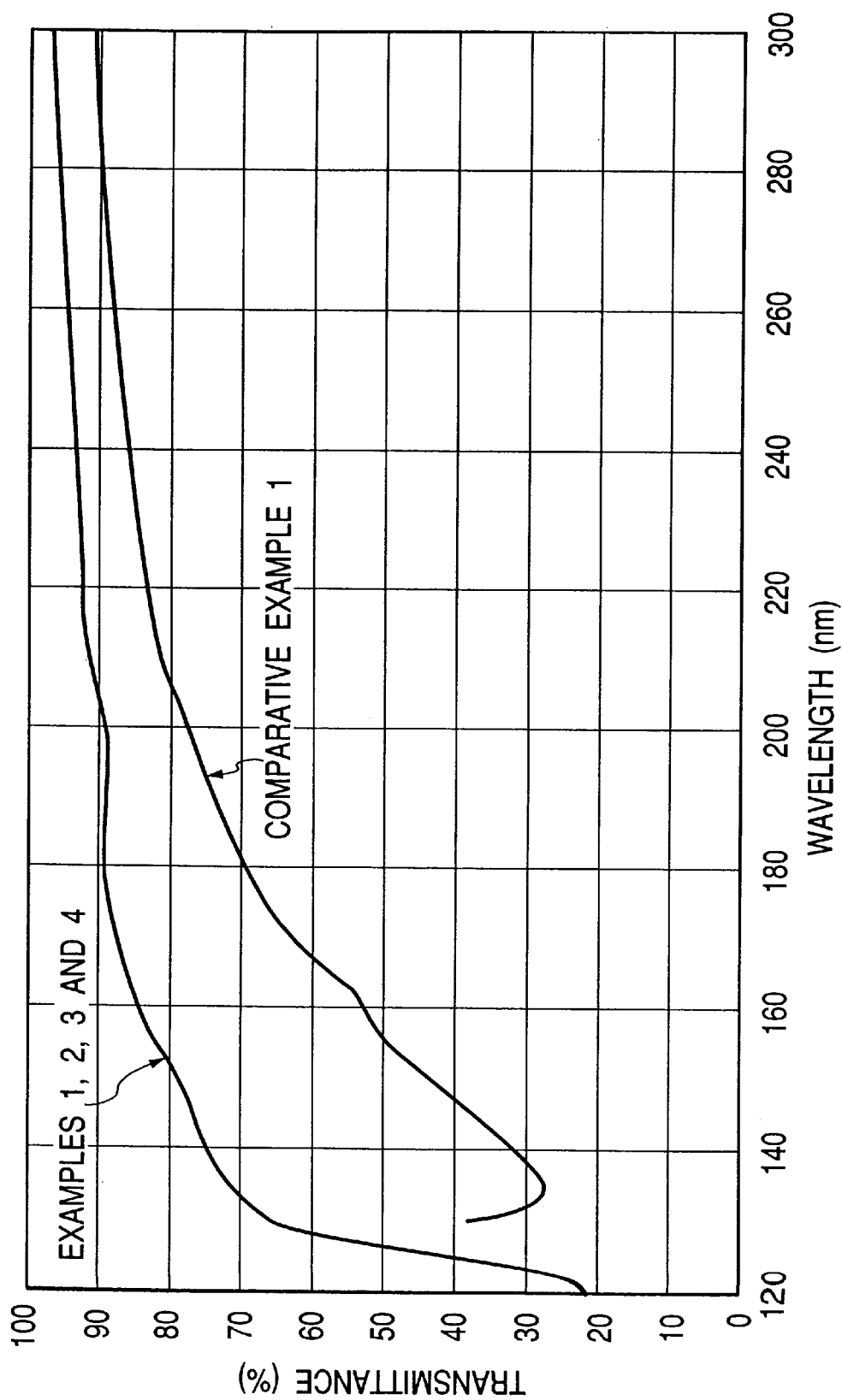
FIG. 8 is a graph illustrating experimental results obtained in examples.

A disk of 10 mm thick was formed by cutting and polishing a crystal of calcium fluoride thus obtained, and the transmission spectrum and degradation percentage of internal transmittance in the vacuum ultraviolet region were measured. Measured results are partially shown in Table 1 and FIG. 8.

The internal transmittance was measured with a vacuum ultraviolet spectrophotometer. The disk was irradiated with $1 \times 10^{-3}$ pulses of a laser with an output of 30 mJ/cm$^2$ $^{and\ a}$ $_{gamma\ ray\ of}$ $1 \times 10^{-4}$ R/H for one hour. The degradation percentage was regarded as decrease percentage of transmittance at 193 nm and 248 nm after irradiation relative to that before irradiation.

Example 2

Though tetrafluoromethane was used as the reactive gas in the refining step in Example 1, trifluoromethane ($CHF_3$), difluoromethane ($CH_2F_2$), hexafluoroethane ($C_2F_6$) and octafluoropropane ($C_3F_8$) were used respectively as reactive gases in Example 2.

Single crystals of calcium fluoride were manufactured in the same manner as in Example 1, except for the reactive gases mentioned above. Experimental results obtained with trifluoromethane are summarized in Table 1 and FIG. 8.

In Example 2, crystals having a transmittance similar to that described in Example 1 were obtained.

Example 3

After the gas filling in the refining step, the temperature was raised from 300° C. to 1250° C. at a rate of about 50° C./h, and the internal gas of the chamber 301 of the refining furnace was replaced with Ar gas (for purging the remaining reactive gas). The Ar gas was filled in the chamber under a pressure of approximately 1 atmospheric pressure. Furthermore, the fluoride raw material was heated to 1380° C. for complete melting. A single crystal of calcium fluoride was manufactured in the same manner as in Example 1, except for points described above. As a result, a single crystal of calcium fluoride having a transmittance similar to that in Example 1 was obtained (Table 1 and FIG. 8).

Example 4

After the vacuum degree attained $1 \times 10^{-6}$ Torr or less in the chamber 301 of the refining furnace in the refining step, tetrafluoromethane diluted to about 10% with Ar was charged into the chamber 301 of the refining furnace and the internal pressure of the chamber 301 of the refining furnace was adjusted to 0.1 atmospheric pressure. After raising the temperature from 300° C. to 1250° C. at a rate of approximately 50° C./h, the chamber 301 of the refining furnace was filled with Ar gas and an internal pressure of the chamber 301 of the refining furnace was adjusted to 1 atmospheric pressure. Current supply to the heater was controlled so that the temperature varied with the lapse of time as indicated by a solid line in FIG. 3. Accordingly, the concentration of tetrafluoromethane was lowered to the order of 1%. The fluoride raw material was further heated to 1380° C. to melt it completely. A single crystal of calcium fluoride was manufactured in the same manner as in Example 1, except for the above. As a result, a crystal having a transmittance similar to that in Example 1 was obtained (Table 1 and FIG. 8).

Comparative Example 1

In Example 1, dehydration was performed at 300° C. and the chamber 301 of the refining furnace was filled with the reactive gas while maintaining the temperature at 300° C. after the vacuum degree reached $1 \times 10^{-6}$ Torr in the chamber 301 of the refining furnace. In Comparative Example 1, in contrast, a fluoride raw material was heated and melted by raising the temperature from 300° C. to 1380° C. at a rate of approximately 50° C./h without filling the chamber with a reactive gas after the vacuum degree reached $1 \times 10^{-6}$ Torr.

When the temperature reached 1380° C., the chamber 301 of the refining furnace was filled with a reactive gas. The reactive gas was maintained in the chamber 301 of the refining furnace for 15 hours after filling of the reactive gas. The reactive gas in the chamber of the refining furnace 301 was then replaced with Ar gas, and the raw material was cooled in the same manner as in Example 1, thereby obtaining a single crystal of calcium fluoride.

Comparative Example 1 was carried out in the same manner as in Example 1 in other respects.

TABLE 1

|  | Transmittance at 135 nm | Degradation Percentage |
| --- | --- | --- |
| Example 1 | 80% | 1% |
| Example 2 | 80% | 1% |
| Example 3 | 80% | 1% |
| Example 4 | 80% | 1% |
| Comparative Example 1 | 30% | 50% |

As understood from the foregoing description, the present invention is capable of providing a fluoride crystal with transmittance that is hardly degraded even when the crystal is irradiated repeatedly for a long-time with a light having a wavelength and a high output. As a result, the present invention makes it possible to provide not only optical parts for excimer lasers which have high stability and reliability but also an optical system for an exposure apparatus.

What is claimed is:

1. A method of manufacturing a fluoride crystal, which comprises the steps:

heating a fluoride raw material in a reactive gas atmosphere at a temperature lower than the melting point of the fluoride raw material;

melting the fluoride raw material in a vacuum atmosphere or an inert gas atmosphere; and cooling the fluoride raw material to crystallize the fluoride raw material.

2. A method of manufacturing a fluoride crystal according to claim 1, wherein the reactive gas is a carbon fluoride-based gas.

3. A method of manufacturing a fluoride crystal according to claim 2, wherein the carbon fluoride-based gas contains at least one kind selected from the group consisting of tetrafluoromethane, trifluoromethane, difluoromethane, hexafluoroethane and octafluoropropane.

4. A method of manufacturing a fluoride crystal according to claim 1, wherein the temperature lower than the melting point is a temperature lower by 50 to 200° C. than the melting point of the fluoride raw material.

5. A method of manufacturing a fluoride crystal according to claim 1, wherein the heating at the temperature lower than the melting point is carried out for 4 to 30 hours.

6. A method of manufacturing a fluoride crystal according to claim 1, wherein a furnace is filled with a vacuum atmosphere or an inert gas atmosphere after the fluoride raw material is placed in the furnace and before the reactive gas is introduced therein, and the fluoride raw material is dehydrated by heating at 100 to 300° C.

7. A method of manufacturing a fluoride crystal according to claim 6, wherein the reactive gas is introduced into the furnace after the internal pressure of the furnace is reduced to a level lower than $1 \times 10^{-5}$ Torr.

8. A method of manufacturing a fluoride crystal according to claim 1, wherein the internal pressure of the furnace is kept at a level lower than $1 \times 10^{-5}$ Torr at the time of melting the fluoride raw material.

9. A method of manufacturing a fluoride crystal according to claim 1, wherein the reactive gas atmosphere is an atmosphere containing a reactive gas and an inert gas.

10. A method of manufacturing a fluoride crystal according to claim 1, wherein the fluoride raw material contains at least one kind of rare earth elements at a total content not exceeding 10 ppm.

11. A method of manufacturing a fluoride crystal according to claim 1, wherein the fluoride raw material is calcium fluoride, barium fluoride or magnesium fluoride.

12. A method of manufacturing a fluoride crystal according to claim 1, wherein the reactive gas contains fluorine.

13. A method of manufacturing an optical part comprising the steps of:

manufacturing the fluoride crystal according to any one of claims 1–11; and shaping a fluoride crystal into an optical part.

14. A method of refining a raw material for manufacturing a fluoride crystal, which comprises the steps:

heating a fluoride raw material in a reactive gas atmosphere at a temperature lower than the melting point thereof;

melting the fluoride raw material in a vacuum atmosphere or an inert gas atmosphere; and cooling the fluoride raw material to solidify the fluoride raw material.

15. A method of refining a raw material for manufacturing a fluoride crystal according to claim 14, wherein the reactive gas is a carbon fluoride-based gas.

16. A method of refining a raw material for manufacturing a fluoride crystal according to claim 15, wherein the carbon fluoride-based gas is at least one kind selected from the group consisting of tetrafluoromethane, trifluoromethane, difluoromethane, hexafluoroethane and octafluoropropane.

17. A method of refining a raw material for manufacturing a fluoride crystal according to claim 14, wherein the temperature lower than the melting point is a temperature lower by 50 to 200° C. than the melting point.

18. A method of refining a raw material for manufacturing a fluoride crystal according to claim 14, wherein the heating at the temperature lower than the melting point is carried out for 4 to 30 hours.

19. A method of refining a raw material for manufacturing a fluoride crystal according to claim 14, wherein the fluoride raw material is dehydrated by heating an inside of a refining furnace filled with a vacuum atmosphere or an inert gas atmosphere to 100 to 300° C. after the fluoride raw material is disposed in the refining furnace and before a reactive gas is introduced into the refining furnace.

20. A method of refining a raw material for manufacturing a fluoride crystal according to claim 19, wherein the reactive gas is introduced into the refining furnace after an internal pressure of the refining furnace is reduced to a pressure lower than $1 \times 10^{-5}$ Torr.

21. A method of refining a raw material for manufacturing a fluoride crystal according to claim 14, wherein an internal pressure of the refining furnace at a time of melting the fluoride raw material is maintained at a level lower than $1 \times 10^{-5}$ Torr.

22. A method of refining a raw material for manufacturing a fluoride crystal according to claim 14, wherein the reactive gas atmosphere is an atmosphere containing a reactive gas and an inert gas.

23. A method of refining a raw material for manufacturing a fluoride crystal according to claim 14, wherein the fluoride raw material contains at least one kind of rare earth elements in a total amount smaller than 10 ppm.

24. A method of refining a raw material for manufacturing a fluoride crystal according to claim 14, wherein the fluoride raw material is calcium fluoride, barium fluoride or magnesium fluoride.

25. A method of refining a raw material for manufacturing a fluoride crystal according to claim 14, wherein the reactive gas contains fluorine.

26. A method of manufacturing a fluoride crystal, which comprises the steps:

arranging a raw material for manufacturing a fluoride crystal refined by a refining method as claimed in any one of claims 14 to 24 in a growing furnace, melting the raw material for manufacturing the fluoride crystal in the refining furnace filled with an inert gas atmosphere or a vacuum atmosphere, and cooling the raw material for manufacturing the fluoride crystal to conduct crystal growth by moving a crucible.

27. A method of manufacturing a fluoride crystal according to claim 26, wherein the growing furnace is filled with a reactive gas atmosphere before melting the raw material for manufacturing the fluoride crystal, and the raw material for manufacturing the fluoride crystal is heated at a temperature lower than the melting point thereof in the reactive gas atmosphere.

28. A method of manufacturing a fluoride crystal according to claim 27, wherein the reactive gas used to fill the growing furnace is a carbon fluoride-based gas.

29. A method of manufacturing an optical part comprising the steps of:

manufacturing a fluoride crystal according to claim 26; and shaping the fluoride crystal into an optical part.

30. A method of manufacturing an optical part according to claim 29, wherein the fluoride crystal is a calcium fluoride crystal having an internal transmittance of 70% or higher with respect to a light with a wavelength of 135 nm.

31. A method of manufacturing an exposure apparatus comprising the steps of:

a) forming an optical part according to claim 13; and b) combining the optical part with a stage for mounting a support member to expose a layer of a photosensitive material on said support member to a light having passed through the optical part.

* * * * *

UNITED STATES PATENT AND TRADEMARK OFFICE
CERTIFICATE OF CORRECTION

PATENT NO. : 6,238,479 B1
DATED : May 29, 2001
INVENTOR(S) : Tomoru Oba

It is certified that error appears in the above-identified patent and that said Letters Patent is hereby corrected as shown below:

<u>Title page,</u>
Item [56] References Cited, insert -- [74] *Attorney, Agent, or Firm* - Fitzpatrick, Cella, Harper & Scinto --.

<u>Column 1,</u>
Line 15, "etc." should read -- etc., --;
Line 30, "Crystals" should read -- Crystal --; and
Line 55, "is," should read -- is --.

<u>Column 2,</u>
Line 4, "etc." should read -- etc., --.

<u>Column 3,</u>
Lines 57 and 64, "by" should be deleted.

<u>Column 5,</u>
Line 26, "steps Si," should read -- steps S1, --.

<u>Column 6,</u>
Line 3, "of" should read -- of the --; and
Line 56, "20" should be deleted.

<u>Column 9,</u>
Line 1, "etc." should read -- etc., ; and
Line 17, "A" should be deleted.

<u>Column 10,</u>
Line 35, "$1 \times 10^{-3}$" should read -- $1 \times 10^3$ --; and
"*and a*" should read -- and a --; and
Line 36, "$_{gamma\ ray\ of} 1 \times 10^{-4}$" should read -- gamma ray of $1 \times 10^4$ --.

UNITED STATES PATENT AND TRADEMARK OFFICE
CERTIFICATE OF CORRECTION

PATENT NO. : 6,238,479 B1
DATED : May 29, 2001
INVENTOR(S) : Tomoru Oba

It is certified that error appears in the above-identified patent and that said Letters Patent is hereby corrected as shown below:

Column 14,
Line 5, "furnace," should read -- furnace; --; and
Line 9, "atmosphere," should read -- atmosphere; --.

Signed and Sealed this

Twenty-sixth Day of February, 2002

Attest:

JAMES E. ROGAN
*Attesting Officer*     *Director of the United States Patent and Trademark Office*